United States Patent
Koduri

[11] Patent Number: 5,971,248
[45] Date of Patent: Oct. 26, 1999

[54] STEADY AUTOROTATION OF WIRE BONDING CAPILLARY

[75] Inventor: Sreenivasan K. Koduri, Dallas, Tex.

[73] Assignee: Texas Instruments Incorporated, Dallas, Tex.

[21] Appl. No.: 08/993,659

[22] Filed: Dec. 18, 1997

Related U.S. Application Data

[60] Provisional application No. 60/033,506, Dec. 19, 1996.

[51] Int. Cl.$^6$ .................................................. H01L 21/60
[52] U.S. Cl. .............................................. 228/4.5; 228/45
[58] Field of Search ............................... 228/4.5, 32, 45, 228/180.5

[56] References Cited

U.S. PATENT DOCUMENTS 4,598,853  7/1986  Hill .......................................... 228/4.5

FOREIGN PATENT DOCUMENTS

402756 A2  12/1990  European Pat. Off. ................. 228/45
5-90321    4/1993   Japan ....................................... 228/45

*Primary Examiner*—Patrick Ryan
*Assistant Examiner*—Jeffrey T. Knapp
*Attorney, Agent, or Firm*—Wade James Brady, III; Richard L. Donaldson

[57] ABSTRACT

A rotation device (100) provides steady, non-stepwise rotation of a wire bonding capillary (10) about the longitudinal axis of the capillary (10). This enables the capillary (10) to be rotated to different angular alignments to perform wire bonding in different directions. The rotation device can include gears (111, 122) or friction pads (211, 222). At least a part (110) of the rotation device (120) is coupled to the capillary (10). Another part (120) of the rotation device (100) is separate from the capillary (10) but is engageable with the first part to provide rotation. Sensing devices (610, 620) may be used to provide precise initial alignment of the capillary (10) and to assist in providing and confirming precise alignment and realignment of the capillary to various bonding directions during wire bonding. A computer may be used to provide automated control and rotation of the sensing devices and the rotation device.

19 Claims, 4 Drawing Sheets

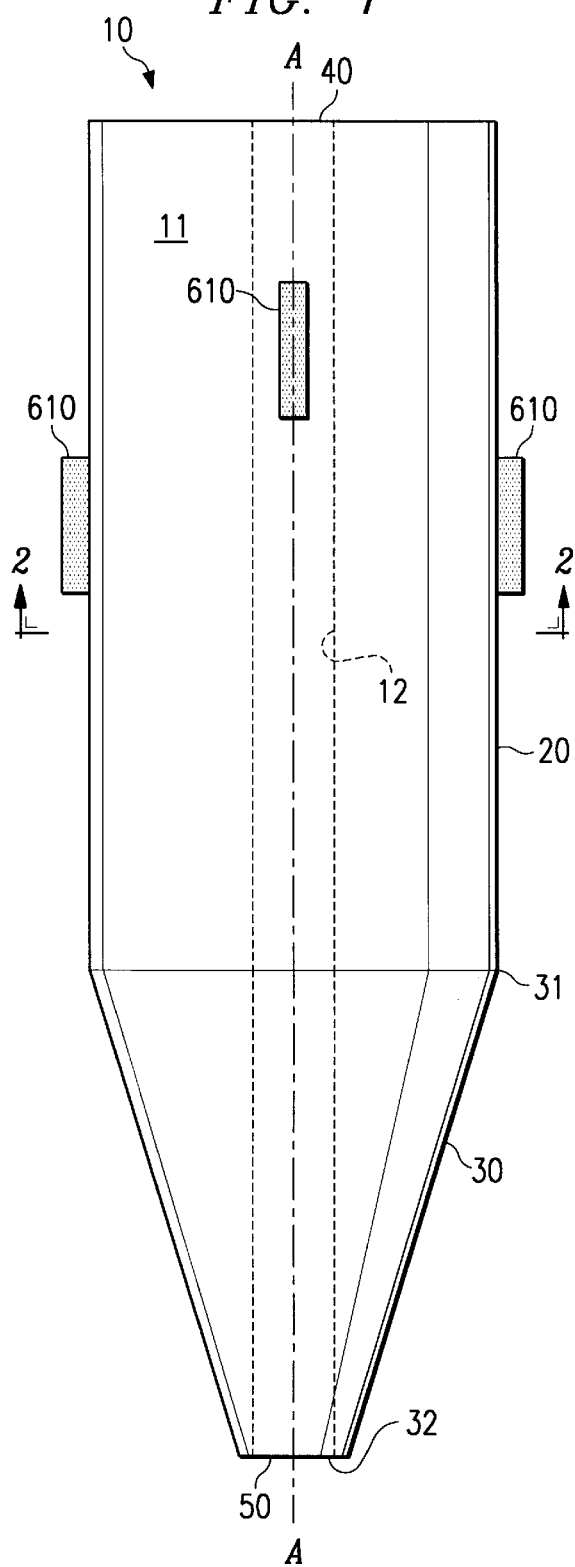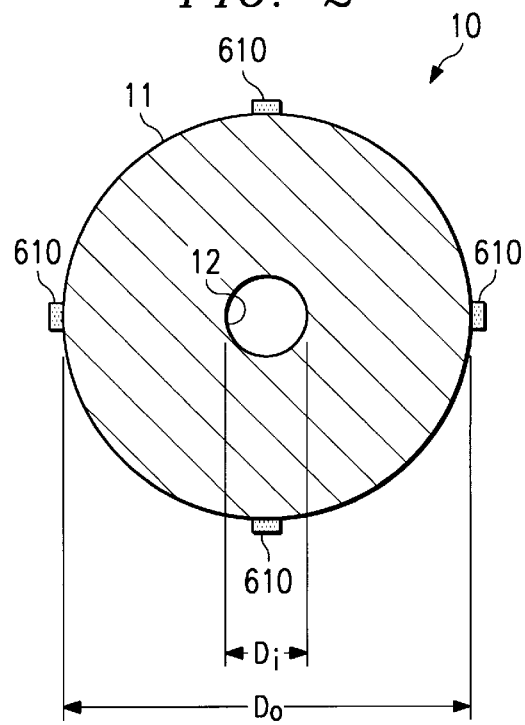

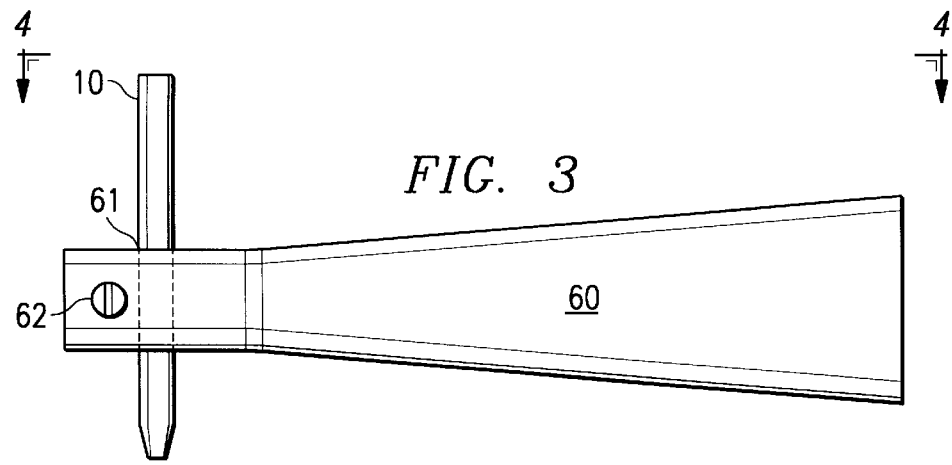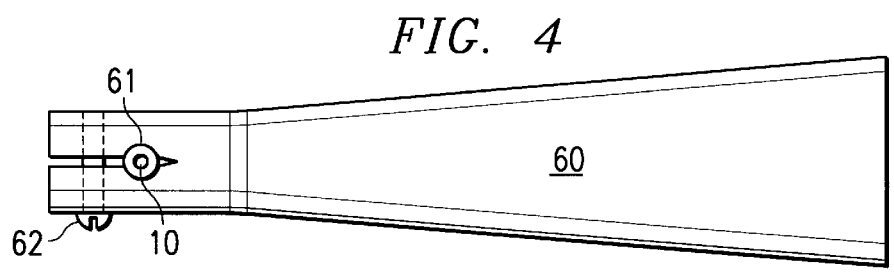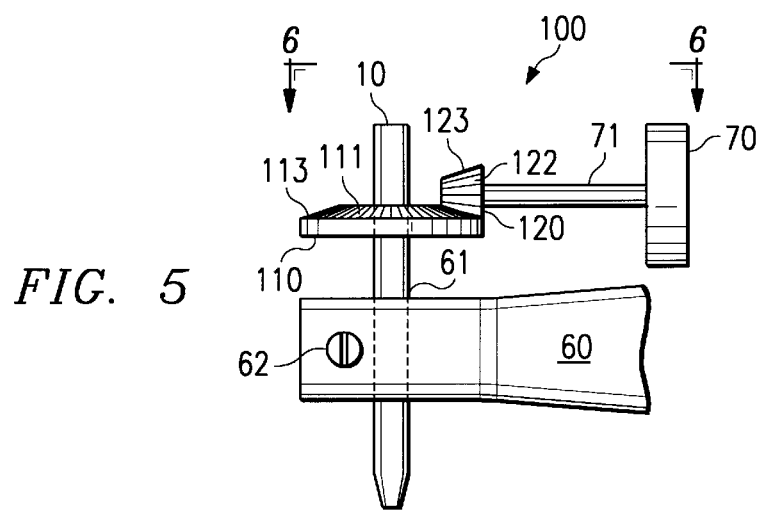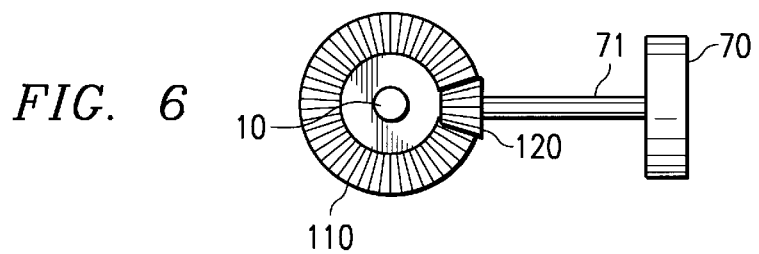

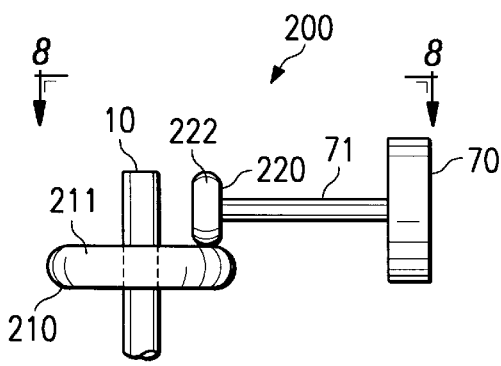
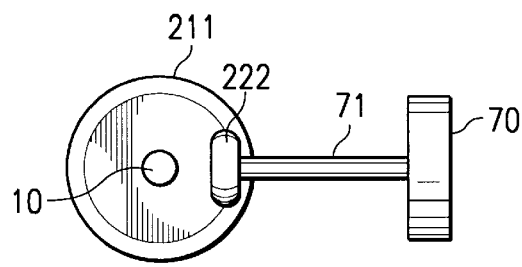
FIG. 7
FIG. 8
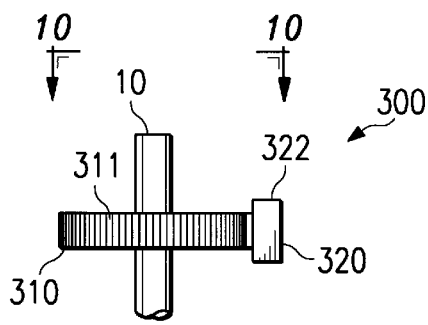
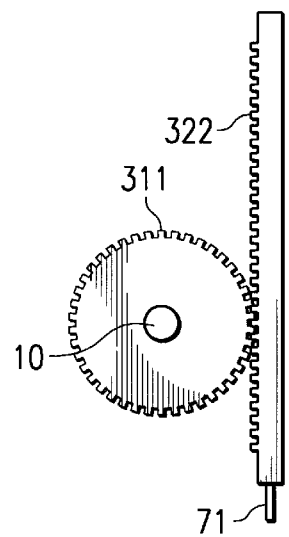
FIG. 9
FIG. 10
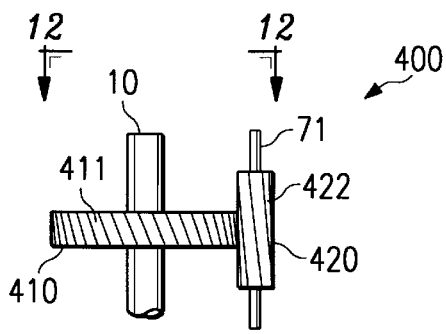
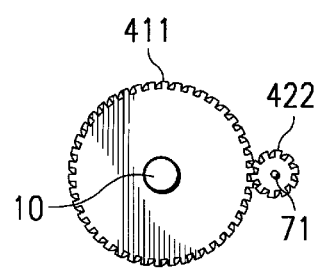
FIG. 11
FIG. 12

STEADY AUTOROTATION OF WIRE BONDING CAPILLARY

This application claims priority under 35 USC §119(e)(1) of provisional application No. 60/033,506 filed Dec. 19, 1996 now abandoned.

TECHNICAL FIELD OF THE INVENTION

The present invention generally relates to a wire bonding process and capillaries used in the wire bonding process during the manufacture of electronic integrated circuit chip packages and, more particularly, to steady autorotation of wire bonding capillaries.

BACKGROUND OF THE INVENTION

Integrated circuit chip packages are typically formed by mounting an integrated circuit chip on a lead frame and coupling these two elements to form a package. The integrated circuit chip and lead frame may be encapsulated. Typically, the chip includes a number of bond pads which may be positioned about a perimeter of the chip according to a predetermined spacing between the bond pads. The lead frame typically includes a number of leads about a perimeter thereof. One type of lead frame, for example, has a generally rectangular shape with each side of the rectangle having a number of leads. The leads may each have a relatively narrow elongated shape.

A lead frame may be said to have an X direction and a Y direction. The X direction is perpendicular to one pair of opposing sides and the Y direction is perpendicular to the other pair of opposing sides. Typically, each lead has a relatively narrow elongated shape defining a lead axis. The lead axis for any given lead frame may extend in the X or Y direction, or be offset by an angle from either the X or Y direction. The angle of offset may vary from lead to lead. Moving from the center of a given side of the lead frame toward the corner leads, the lead axes may be angularly offset from perpendicular by increasing amounts. Also, a bonding path is defined by the direction from a bond pad to a corresponding lead. The bonding wire may extend along the bonding path. For any given set of corresponding bond pads and leads, the bonding path may extend in the X or Y direction, or be offset by an angle from either the X or Y direction.

In order to electrically couple the integrated circuit chip to the leads of the lead frame, a wire bonding technique is often used. A wire bonding machine may have a spool of bonding wire mounted on the machine. The bonding wire may be threaded through a capillary which is mounted to a horn of the wire bonding machine. The horn may be manipulated to move the capillary both vertically and horizontally. Typically, the wire bonding machine includes a device for heating or applying a spark to an end of the bonding wire which protrudes from an exit end of the capillary. The molten wire may form the shape of a ball which is placed on a target bond pad by manipulating the horn to move the capillary.

After this bond pad bond is created, a sufficient amount of bonding wire is released to allow the capillary to be moved to a location near an inner end of a target lead of the lead frame. The capillary is manipulated to connect the bonding wire to the inner end of the target lead and cut off the bonding wire so that the bonding wire protruding from the exit end of the capillary is now free to form a new wire bond between a new target bond pad and target lead. Any type of suitable bond may be made at either the bond pad or the lead, including ball bonds, stitch bonds and wedge bonds. A ball bond may be used, for example, at the bond pad. A stitch bond may be used, for example, at the lead. To complement the bonding process the package may be heated. Also, ultrasonic energy may be applied.

Problems in wire bonding techniques arise in part from the desire to increase the number of leads in a given package and to make integrated circuit chip packages smaller and smaller. This may require that the bonding pads located on the chip be made smaller and be spaced closer together. The same can be said for the leads on a lead frame.

The exit end of a wire bonding capillary is often referred to as the capillary face. Previous capillaries have had a circular face. A disadvantage of having a capillary with a circular face is that the spacing between bonds is limited. After a bond is made at a particular bond pad, for example, if the adjacent bond pad is too close, then the capillary face may strike the ball bond which has been made at the first bond pad during the process of making a bond on the adjacent bond pad. One method for solving this shortcoming is to use a wire bonding capillary with a non-circular face. This type of approach is shown, for example, in U.S. Pat. No. 5,544,804 issued to Test et al., which is hereby incorporated by reference for all purposes. The Test et al. patent shows a BowTI™ capillary having a non-circular face. The face of a BowTI™ capillary may have a shape which includes a pair of opposed convex sides joining a pair of opposed concave sides. The BowTI™ capillary may be generally described as having a longitudinal axis extending across the midpoints of the convex sides and through the center of the BowTI™. The BowTI™ capillary allows ball bonds, for example, to be made closer to one another than with a circular capillary face. This can be accomplished because the concave sides avoid striking adjacent bonds. The BowTI™ capillary can also make other types of bonds including stitch bonds.

A need arising from the use of capillaries having non-circular faces is precise alignment of the longitudinal axis of the capillary face along either the X or Y direction of the lead frame, or along the longitudinal axis of a target lead, or along a given bonding path as necessary. Precise alignment of non-circular capillaries is especially difficult due to the relatively small size of a typical capillary face (e.g., 4–8 mils). Improper alignment of the capillary, particularly in view of the decreasing size of integrated circuit chip packages, can lead to defective wire bonds during the manufacturing process. This can result from many factors including improper positioning of the capillary face over the bond pad, the lead or both. Defective wire bonding can also occur when improper alignment causes the capillary to strike and/or damage an existing bond during the formation of a subsequent bond. Other problems, shortcomings and disadvantages of known capillaries and wire bonding techniques exist.

SUMMARY OF THE INVENTION

It is an object of the present invention to address the needs associated with capillaries used in wire bonding.

It is a further object of the present invention to provide a capillary for a wire bonding machine which may be easily aligned during installation of the capillary into the wire bonding machine.

It is a further object of the present invention to provide a capillary for wire bonding which may be easily aligned and realigned during or after rotation of the capillary during the process of manufacturing an integrated circuit chip package.

It is a further object of the present invention to enable rotation of a capillary to a precise rotational position after the capillary has been installed into a wire bonding machine.

It is a further object of the present invention to provide a capillary, the alignment of which may be easily established and/or checked during use of the capillary.

It is a further object of the present invention to provide automated, steady, non-stepwise rotation of wire bonding capillaries.

It is a further object of the present invention to provide a computer-controlled wire bonding system in which rotation of a capillary is controlled by a computer in response to information regarding the orientation of leads on a lead frame undergoing the wire bonding process.

To accomplish these and other objects of the present invention, and in accordance with a first embodiment of the present invention, a device is provided for rotating a wire bonding capillary. The device includes a first part which is adapted to be coupled to the capillary, and a second part which is engageable with the first part to impart steady rotation to the capillary.

According to an aspect of this embodiment, the first part may be a first rotation element and the second part may be a second rotation element. The first and second rotation elements may cooperate to provide steady rotation of the capillary. According to various alternative aspects, the first and second rotation elements may include bevel gears, racks, pinions, friction pads and helical gears.

In accordance with another aspect of the present invention, a wire bonding capillary is provided. The capillary has a tubular body portion and a first rotation element coupled to the tubular body portion. The first rotation element is engageable with a second rotation element to impart steady rotation to the capillary.

In accordance with a second embodiment of the present invention, a wire bonding machine is provided. The machine has a horn and a capillary rotatably mounted on the horn. A rotation device is at least partially coupled to the capillary. The rotation device is adapted to impart steady rotation to the capillary.

According to various features of the present invention, the capillary may include indicators which cooperate with detectors to indicate the rotational alignment of the capillary. These sensing components may be used to indicate that a precise rotational alignment of the capillary has been achieved after the rotation device has rotated the capillary by a given angular amount.

A computer may be provided which may be coupled to the sensing devices and to the rotation device. The computer may control rotation of the capillary according to information from the sensing devices and/or information regarding the orientation of a lead frame undergoing the wire bonding process.

BRIEF DESCRIPTION OF THE DRAWINGS

For a more complete understanding of the present invention and for further features and advantages, reference is now made to the following description taken in conjunction with the accompanying drawings, in which:

FIG. 1 is a wire bonding capillary in accordance with the present invention;

FIG. 2 is a cross section of the wire bonding capillary of FIG. 1 taken along arrows 2—2 in FIG. 1;

FIG. 3 is a horn of a wire bonding machine in accordance with the present invention;

FIG. 4 is a top view of the horn of FIG. 3 viewed in the direction of arrows 4—4 of FIG. 3;

FIG. 5 depicts a rotation device and capillary in accordance with an alternative aspect of a first embodiment of the present invention;

FIG. 6 is an end view of the rotation device and capillary of FIG. 5 viewed in the direction of arrows 6—6 of FIG. 5;

FIG. 7 depicts a rotation device and capillary in accordance with an alternative aspect of the first embodiment;

FIG. 8 is an end view of the rotation device and capillary of FIG. 7 viewed in the direction of arrows 8—8 of FIG. 7;

FIG. 9 depicts a rotation device and capillary in accordance with an alternative aspect of the first embodiment;

FIG. 10 is an end view of the rotation device and capillary of FIG. 9 viewed in the direction of arrows 10—10 of FIG. 9;

FIG. 11 depicts a rotation device and capillary in accordance with an alternative aspect of the first embodiment;

FIG. 12 is an end view of the rotation device and capillary of FIG. 11 viewed in the direction of arrows 12—12 of FIG. 11.

DETAILED DESCRIPTION OF THE INVENTION

Figure 13:
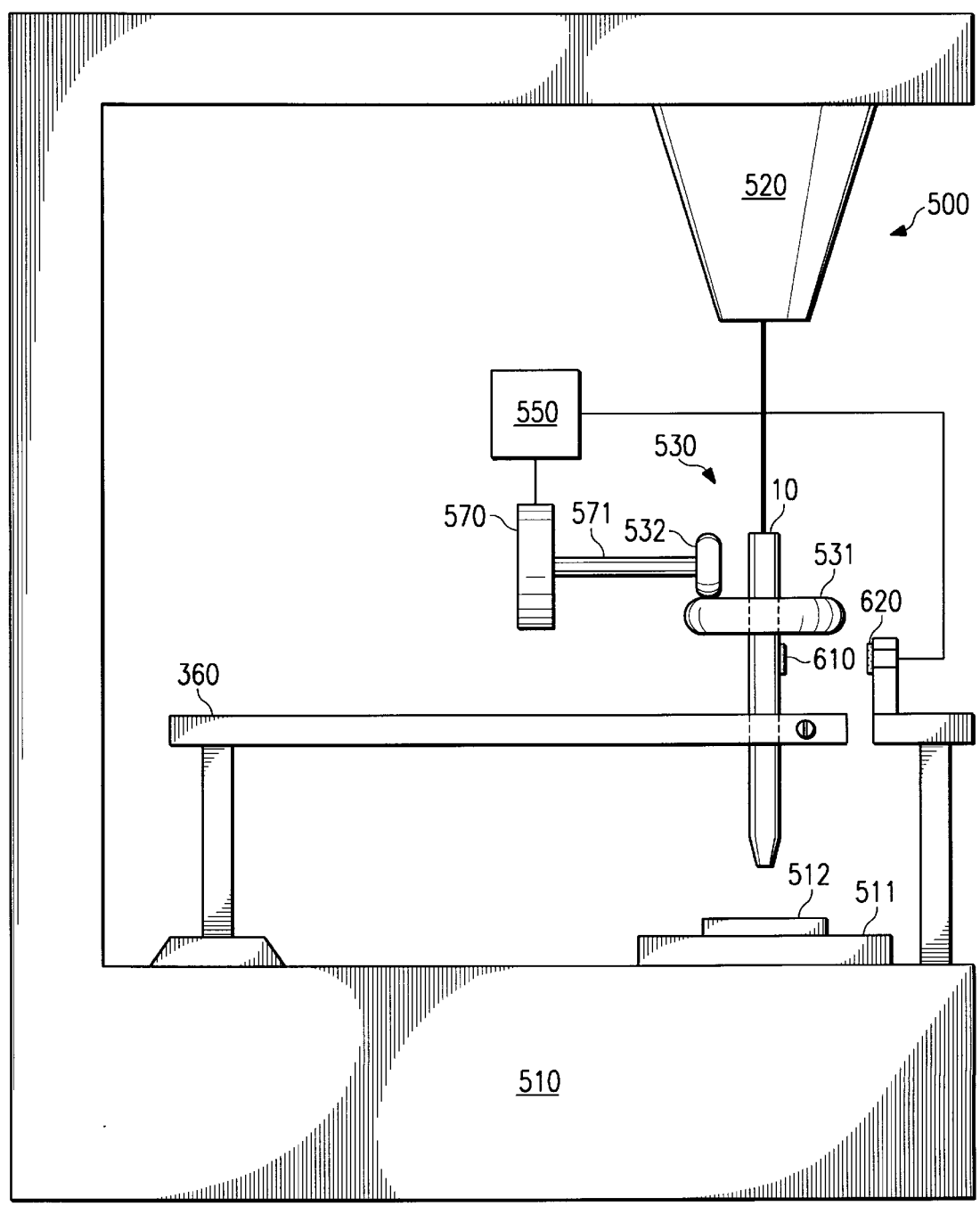
FIG. 13 is a rotation device in accordance with a second embodiment of the present invention.

Wire bonding machines are generally known. A typical wire bonding machine includes a spool of bonding wire which may comprise any suitable bonding material such as gold. The bonding wire is fed through a guide which is generally known as a capillary. This capillary also acts as the bonding tool. The capillary may be mounted on an arm of the wire bonding machine known as a horn.

A wire bonding system may include a wire bonding machine which has a horn. A capillary is mounted into the horn and guides bonding wire from a source to various bonding points on the integrated circuit chip package. The capillary may have one or more indicators located thereon which provide one or more signals to be received by one or more detectors spaced from the capillary. The signals indicate the rotational alignment of the capillary. Therefore, the signal also indicates the direction of an axis of the face of the capillary. Each signal may have a relative signal strength which indicates an angular offset of the capillary face compared to a predetermined, desired alignment.

During operation, the capillary may be rotated to a first rotational alignment at which the capillary face axis extends in a first direction. A first signal received by the detector indicates when the first rotational alignment has been achieved. A first bond may then be made at a first bond point (e.g., at a bond pad on the integrated circuit chip) by guiding the capillary to the first bond point.

The capillary may then be realigned by rotating the capillary to a second rotational alignment so that the capillary face axis extends in a second direction different from the first direction. A second bond may then be made at a second bond point (e.g., at a lead on the lead frame) by guiding the capillary to the second bond point.

The capillary may then be rotated back to the first direction or to a third direction for a subsequent bond (e.g., at a second bond pad on the integrated circuit chip). Rotation of the capillary is achieved by the cooperation of the indicators and detectors and the production of signals which indicate rotational alignment and realignment. The ability to precisely rotate the capillary is especially beneficial for capillaries with non-circular faces. An axis of a non-circular face is ideally aligned in the direction of bonding when a bond is made. For example, it may be desirable to align the capillary face axis along the lead axis. Furthermore, as wire bonds are made around an integrated circuit chip package, the direction of bonding may change. The present invention is adapted to changing bonding directions. Further aspects of an overall capillary alignment system are disclosed in U.S. patent application Ser. No. 08/993,638 which is assigned to Texas Instruments Incorporated. This application was filed on Dec. 18, 1997 and is hereby incorporated by reference for all purposes.

The present invention, among other things, contemplates rotatably mounting the capillary on the horn and providing a device which enables steady, non-stepwise rotation of the capillary about its longitudinal axis. The device may be used to rotate the capillary during the wire bonding process. Indicators and detectors may be used to achieve precise angular amounts of rotation. Optionally, a first component of the device may be rotated by a specific amount. This component may impart rotation to another component of the device which is coupled to the capillary. The specific amount of rotation of the first component corresponds to a specific amount of rotation of the second component and, therefore, of the capillary. The device may be used to initially rotate the capillary to a precise initial alignment (e.g., upon installation of the capillary onto the horn). The device may also be used to provide steady rotation of the capillary by precise angular amounts during the wire bonding process. The steady, non-stepwise movement allows fine resolution of the desired angular position of the capillary.

As shown in greater detail in FIG. 1, capillary 10 has a tubular body comprising a shaft portion 20 which is integral with a tip portion 30. The capillary has a longitudinal bore extending through its interior in the general direction of longitudinal axis AA. The bore of capillary 10 has an entry end 40 and an exit end 50. Bonding wire may be inserted into entry end 40 to extend through the interior of capillary 10 and exit from capillary 10 through exit end 50.

Preferably, shaft portion 20 is cylindrical in shape and has a circular cross section as shown more clearly in FIG. 2. However, other shapes may be used so long as the bonding wire may be threaded through the interior of capillary 10. For example, the capillary may have a rectangular or elliptical cross section. Preferably, the cross-section of capillary 10 is defined by a bore of diameter $D_i$ and an outer surface of diameter $D_o$. Preferably, inner diameter $D_i$ is constant throughout an entire length of the bore of capillary 10. However, if capillary 10 has a constant wall thickness, then $D_i$ will vary according to changes in $D_o$.

Preferably, tip portion 30 is tapered downwardly and inwardly from a first point 31, where tip portion 30 meets shaft portion 20, to a second point 32 located at the exit end of capillary 10. Preferably, the outer diameter of tip portion 30 at first point 31 is equal to $D_o$ of shaft portion 20. Preferably, the outer diameter of tip portion 30 at second point 32 is a predetermined value which is less than the outer diameter at first point 31.

Capillary 10 may be formed from any suitable material. However, it is preferable that capillary 10 is formed from a high-strength material. For example, capillary 10 may be formed from a high-strength ceramic material.

A horn of a wire bonding machine (not shown) is depicted in FIGS. 3 and 4. Horn 60 has a capillary mounting receptacle 61 for mounting capillary 10 as shown. Horn 60 also preferably includes a locking mechanism 62 for selectively locking capillary 10 into capillary mounting receptacle 61. Preferably, capillary 10 is freely rotatable about its longitudinal axis within mounting receptacle 61 when locking mechanism 62 is in the unlocked position.

Once capillary 10 is aligned according to a precise, predetermined initial alignment (e.g., so that the axis of the capillary face is aligned for X-direction bonding) it may be necessary to rotate capillary 10 about longitudinal axis AA by a precise angular amount. This may be necessary, for example, to align the axis of the capillary face along the Y-axis or in some other direction offset from either the X-axis or the Y-axis. For instance, a target lead might be oriented fifteen degrees offset counterclockwise from the X-axis. If the face of capillary 10 is initially aligned along the axis, then capillary 10 should be rotated precisely fifteen degrees counterclockwise (or 345 degrees clockwise) to ensure optimal bonding on the angularly offset target lead.

In accordance with a first embodiment of the present invention, a device provides steady, non-stepwise rotation of capillary 10. In other words, as long as the device is activated, and as long as the capillary is free to rotate, the device rotates capillary 10 in a continuous, non-stepwise, uninterrupted manner. This allows a fine resolution of the angular position to which capillary 10 can be rotated. The device is at least partially coupled to capillary 10. Preferably, a first part of the device is coupled to capillary 10. A second part of the device is separate from capillary 10 but engageable with the first part to impart steady rotation to capillary 10. Preferably, the first part is coupled to a central region of the shaft portion 20 of capillary 10. Also, the first part preferably surrounds shaft portion 20 and has a rotational axis which is coaxial with the longitudinal axis of capillary 10.

According to one alternative aspect of the first embodiment, as depicted in FIGS. 5 and 6, a device 100 is provided for enabling steady rotation of capillary 10. Device 100 includes a first rotation element 110 and a second rotation element 120. Preferably, first and second rotation elements 110 and 120 cooperate with one another to impart steady non-stepwise rotation to capillary 10.

Preferably, first rotation element 110 comprises a first bevel gear 111 and second rotation element 120 comprises a second bevel gear 122. First bevel gear 111 has a plurality of first teeth formed thereon which interfit with a plurality of second teeth formed on second bevel gear 122.

First rotation element 110 is coupled to an exterior surface of capillary 10. These two elements may be coupled together using any suitable bonding technique, such as adhesive bonding with consideration given to minimizing any interference with acoustic damping. Preferably, any bonding technique used will withstand the environmental conditions under which the capillary 10 will operate during the wire bonding process. Alternatively, first rotation element 110 may be integrally formed as a part of capillary 10.

Second gear 122 preferably interengages with first gear 111. Preferably, second gear 122 is provided with fewer teeth than first gear 111 so that second gear 122 has a smaller diameter than first gear 111. However, second gear may be the same size as, or larger than, first gear 111.

Second gear 122 is coupled to a power source 70 by a drive shaft 71. Power source 70 is any suitable unit which provides power to rotate drive shaft 71, thereby rotating second gear 122. For example, power source 70 may be an electrical motor or may represent a person who may manually turn drive shaft 71. When power source 70 is activated, rotation is imparted to drive shaft 71 and, therefore, to second rotation element 120. Second rotation element 120 is engageable with first rotation element 110 to rotate first rotation element 110. Because first rotation element 110 is coupled to capillary 10, rotation is also imparted to capillary 10. Preferably, power source 70 is only activated to rotate capillary 10 when locking mechanism 62 is in the unlocked position. Preferably, locking mechanism 62 and power source 70 are synchronized, for example, through computer controls (not shown) so that locking mechanism 62 is automatically unlocked when power source 70 is activated. Preferably, locking mechanism 62 is capable of locking capillary 10 into mounting receptacle 61 in a predetermined location along the longitudinal axis of capillary 10. This ensures that capillary 10 will always be in the proper longitudinal location with respect to a mounting platform of the wire bonding machine and/or lead frames undergoing the wire bonding process.

First bevel gears 111 has a beveled edge 113 and 122 has a beveled edge 123. The beveled edges 113 and 123 cooperate to offset the rotational axes of gears 111 and 122. Thus, the axes of rotation are nonparallel. Preferably, the axes of rotation are offset by about ninety degrees. This allows drive shaft 71 to extend radially outward from the longitudinal axis of capillary 10. Therefore, power source 70 may be located radially outward and away from capillary 10 without the need for additional gears or other similar components. Having power source spaced radially from capillary 10, among other things, avoids power source 70 interfering with the operation of capillary 10.

According to another alternative aspect of the first embodiment, as shown in FIGS. 7 and 8, rotation device 200 comprises first rotation element 210 and second rotation element 220. First rotation element 210 is coupled to capillary 10 and comprises a first friction pad 211. Second rotation element 220 is discrete from capillary 10 and comprises a second friction pad 222. First and second friction pads 211 and 222 may comprise wheels or discs. First and second wheels 211 and 222 are preferably formed from a material that provides friction between these two elements. For example, first and second friction pads 211 and 222 may be formed from rubber or a rubber-like material.

First and second friction pads 211 and 222 are engageable with one another to provide rotation to capillary 10. Preferably second friction pad 222 rotates about an axis which is substantially perpendicular to the axis of rotation of first friction pad 211. Preferably, an edge of second friction pad 222 is brought into contact with a side surface of first friction pad 211 at a point radially offset from the rotational axis of first friction pad 211. More preferably, the point of contact of the two wheels is closer to an edge of first friction pad 211 than to the rotational axis of first friction pad 211. Rotation of second friction pad 222 may be provided as described above.

According to an optional feature of this aspect, the first and second friction pads 211 and 222 may be oriented such that their axes of rotation are not offset. Thus, if the two wheels are in substantially the same plane, their axes of rotation will be substantially parallel. In this arrangement, an edge of second friction pad 222 would engage an edge of first friction pad 211 to impart rotation to first friction pad 211.

According to another alternative aspect of the first embodiment, as shown in FIGS. 9 and 10, rotation device 300 comprises first rotation element 310 and second rotation element 320. First rotation element 310 is coupled to capillary 10 and comprises a first gear 311. Second rotation element 320 is discrete from capillary 10 and comprises a second gear 322. First and second gears 311 and 322 cooperate to provide a rack and pinion assembly. For example, first gear 311 is a pinion to cooperate with rack 322. Rack 322 comprises a bar having teeth on one side to interfit with corresponding teeth on pinion 311.

Preferably, rack 322 is moved linearly and is not rotated. When rack 322 engages pinion 311, the linear movement of rack 322 is transformed into rotational movement of pinion 311. Thus, the rotational axis of first rotation element 311 is non-intersecting and ninety degrees offset from the direction of movement of rack 322. Alternatively, rack 322 may be substituted with a worm gear.

Rack 322 may be moved by a power supply as previously described, provided the power supply arrangement is modified to provide back-and-forth linear movement. For instance, the power supply may rotate a drive shaft about an axis parallel to the rotational axis of pinion 311. The drive shaft may be coupled to a second pinion which is rotated and engages rack 322 to impart linear movement thereto.

According to another alternative aspect of the first embodiment, as shown in FIGS. 11 and 12, rotation device 400 comprises first rotation element 410 and second rotation element 420. First rotation element 410 is coupled to capillary 10 and comprises a first helical gear 411. Second rotation element 420 is discrete from capillary 10 and comprises a second helical gear 422. First and second gears 411 and 422 preferably have parallel axes of rotation, but the rotational axes may be skewed. Second rotation element 420 may be rotated as previously described to impart rotation to first rotation element 410 and, therefore, to capillary 10.

According to a second embodiment of the present invention, as shown in FIG. 13, a rotation device 530 of the present invention (e.g., device 100, 200, 300 or 400) is incorporated into a wire bonding machine. Machine 500 comprises a body 510 having a mounting platform 511. Mounting platform 511 is adapted to receive a lead frame 512 for wire bonding. Machine 500 includes horn 560 attached thereto. Horn 560 has capillary 10 mounted thereon and may be manipulated to wire bond lead frame 512 resting on mounting platform 511. Machine 500 also includes a source (e.g., a spool) of bonding wire 520 mounted thereon. The bonding wire may be threaded through capillary 10 and used to complete wire bonds on the lead frame. Rotation device 530 is at least partially coupled to capillary 10. Preferably, a first part 531 of rotation device 530 is coupled to capillary 10 and a second part 532 of rotation device 530 is separate from capillary 10. First part 531 is engageable with second part 532 to impart steady, non-stepwise rotation to capillary 10. Preferably, when the second part engages the first part, rotational or linear movement of the second part causes the first part to rotate relative to the second part. Preferably, second part 532 is coupled by a drive shaft 571 to a power supply 570, which rotates drive shaft 571.

According to a feature of the present invention, capillary 10 may have one or more indicators 610 incorporated into the body thereof to provide one or more sensing signals to one or more detectors. The signals may be variable strength signals and may indicate the alignment of the capillary and an axis of the capillary face. The indicators may be of any type including active, passive, mechanical, electrical, optical, magnetic, and others. Additionally, one or more second detectors 620 may be provided to cooperate with the one or more indicators on capillary 10.

Preferably, one of the indicators is a primary indicator and the others are secondary indicators. The primary indicator may be used for establishing precise initial alignment and for determining rotational offsets of capillary 10 to realign capillary 10 during the wire bonding process as the bonding direction changes. The secondary indicators are preferably used to establish and confirm rotational offsets and/or alignments during the wire bonding process.

The indicators, for example, may comprise reflective markings or paint strips which may be optically detected. Preferably, at least one marking is aligned with the axis of the face of capillary 10. The one or more detectors 620 (e.g., a transducer) may detect the markings and produce one or more corresponding electrical detection signals. For example, if the primary indicator reflects is detected by a transducer, then the face of capillary 10 is aligned in a first direction for wire bonding. If a secondary indicator is offset ninety degrees clockwise from the primary indicator, and if the secondary indicator is detected, then capillary 10 is offset ninety degrees counterclockwise from the first direction. The electrical signal from the transducer may be passed to a display (not shown) to indicate an offset or that capillary 10 is properly aligned.

Thus, the indicators and detectors cooperate to provide signals, which may be used to determine the rotational position of capillary 10. Alternatively, these components may cooperate to provide a signal with a relative signal strength. For example, the signal may be stronger when the indicator and the detector are in closest proximity to one another. The signal may weaken as these two elements are separated by rotation of capillary 10. The strength of the sensed signal would indicate an amount of angular offset from a predetermined rotational alignment of capillary 10.

The indicators and detectors may be used to establish precise initial alignment of the capillary 10 and the rotation device 530 with respect to horn 560 and/or the bonding platform 511 or lead frame 512. After initial alignment, and during the wire bonding process, the sensing components may be used in conjunction with the rotation device 530 to precisely rotate capillary 10 to a desired angular position described above. This is especially useful for capillaries with non-circular faces. This process allows the capillary face axis to be aligned and realigned to extend in different bonding directions as bonds are made about the integrated circuit chip package. The sensing components may also be used to confirm the proper desired rotational alignment of capillary 10.

According to another feature of the present invention, rotation and alignment may be completely controlled by a computer 550. In this situation, the computer 550 determines the desired rotational position of the capillary. This can be established based on a predetermined configuration of a lead frame. The detectors provide input to the computer regarding the signals sensed from the indicators. This information indicates the existing rotational position of the capillary. If the capillary is not properly aligned, the computer may send a message which activates the power supply. Another message is sent from the computer to deactivate the locking mechanism of horn 560 so that device 530 may rotate capillary 10. When the detectors sense a signal from the indicators which indicates that capillary 10 has reached the desired rotational position, input is sent from the detectors to the computer. The computer sends an activation message to the locking mechanism and a deactivation message to the power supply. The bonding machine may then proceed with bonding.

According to an aspect of this feature, other sensing devices (not shown) are provided to sense the orientation of each respective lead directly. This may be accomplished, for example, by known scanning techniques. This information is transmitted to the computer, which sends corresponding activation and deactivation messages to the power supply and the locking mechanism. The power supply rotates the capillary to an exact position based on the orientation for a particular lead, as opposed to a predetermined orientation of a lead frame stored in the computer memory. The sensing devices send further input to the computer when the capillary reaches the correct rotational position and the computer sends the appropriate activation and deactivation messages to the locking mechanism and power supply, respectively.

It should be noted that the rotation devices of the present invention do not require sensing devices. For example, if precise rotational alignment is not required, then the use of sensing devices may be unnecessary. Also, a power supply may be selected which has a regulator to control the amount of rotation of the second rotation element. In such a case, the corresponding rotation of the first rotation element may be easily calculated. Therefore, assuming a precise initial alignment of the capillary, precise alignment during the wire bonding process may be achieved without the use of sensing devices. In another alternative, a micrometer may be used as the power supply with the capillary acting as the rotating shaft.

The present invention has thus been described in connection with the preferred embodiments, which are intended as examples only. It will be appreciated by those having ordinary skill in the relevant art that modifications may be made to these embodiments without departing from the scope and spirit of the invention as defined by the appended claims.

What is claimed is:

1. A wire bonding machine, comprising:

a horn;

a capillary rotatably mounted on the horn;

a rotation device at least partially coupled to the capillary and adapted to impart steady, and rotation to the capillary;

wherein the machine is used to wire bond a lead frame, the machine further comprising a computer, the computer activating the rotation device in response to an orientation of the lead frame.

2. A wire bonding machine, comprising:

a horn;

a capillary rotatably mounted on the horn;

a rotation device at least partially coupled to the capillary and adapted to impart steady rotation to the capillary;

wherein the machine is used to wire bond a lead frame, the machine further comprising a computer, the computer activating the rotation device in response to stored information corresponding to an orientation of the lead frame.

3. A wire bonding machine, comprising:

a horn;

a capillary rotatably mounted on the horn;

a rotation device at least partially coupled to the capillary and adapted to impart steady rotation to the capillary;

at least one indicator coupled to the capillary; and at least on detector cooperative with the at least one indicator to determine a rotational alignment of the capillary.

4. The wire bonding machine of claim 3, the machine further comprising a computer, the computer activating the rotation device in response to a signal provided to the at least one detector by the at least one indicator.

5. A capillary orientation system for orientating the rotational position of a semiconductor wire bonding capillary which comprises:

a capillary having an axis; and a device engaging said capillary and imparting continuous rotational motion to said capillary about said axis.

6. The system of claim 5 wherein said continuous rotational motion is variable.

7. A wire bonding machine, comprising:

a horn;

a capillary rotatably mounted on the horn; and a rotation device at least partially coupled to the capillary and adapted to impart continuous variable controlled rotation to the capillary.

8. The wire bonding machine of claim 7 further comprising:

a source of bonding wire; and a bonding platform adapted for receiving a lead frame, the bonding wire threadable through the capillary to perform wire bonding on a lead frame disposed on the bonding platform.

9. The wire bonding machine of claim 7, wherein the rotation device comprises:

a first rotation element coupled to the capillary; and a second rotation element engageable with the first rotation element to impart steady rotation to the capillary.

10. The wire bonding machine of claim 9, wherein when the second rotation element engages the first rotation element, rotation of the second rotation element causes rotation of the first rotation element.

11. A device for rotating a wire bonding capillary, the device comprising:

a capillary apparatus; and a part engageable with said capillary apparatus to impart continuous variable controlled rotation to the capillary.

12. The device of claim 11, wherein said capillary apparatus includes a capillary and a first rotation element, and wherein said part is a second part comprising a second rotation element cooperative with the first rotation element to impart said continuous variable rotation to said capillary.

13. The device of claim 12, wherein at least one of the first and second rotation elements comprises a bevel gear.

14. The device of claim 12, wherein at least one of the first and second rotation elements comprises a friction pad.

15. The device of claim 12, wherein at least one of the first and second rotation elements comprises a rack.

16. The device of claim 12, wherein at least one of the first and second rotation elements comprises a pinion.

17. The device of claim 12, wherein at least one of the first and second rotation elements comprises a helical gear.

18. The device of claim 12, the first rotation element having a first rotatable surface, the second rotation element having a second rotatable surface, rotation of said second rotatable surface while engaging said first rotatable surface causing rotation of said first rotation element.

19. The device of claim 12, the first rotation element have a first rotatable surface, the second rotation element have a second rotatable surface, said second rotatable surface engaging said first rotatable surface to impart rotation to the first rotation element.

* * * * *